(12) United States Patent
Nimura et al.

(10) Patent No.: US 7,157,739 B2
(45) Date of Patent: Jan. 2, 2007

(54) ACTIVE MATRIX TYPE ELECTRO-OPTICAL DEVICE WITH PATTERNS OF CONTACT HOLE FORMATION-POSITIONS AND ELECTRONIC APPARATUS

(75) Inventors: Toru Nimura, Suwa (JP); Shin Fujita, Chino (JP)

(73) Assignee: Seiko Epson Corporation, Tokyo (JP)

( * ) Notice: Subject to any disclaimer, the term of this patent is extended or adjusted under 35 U.S.C. 154(b) by 66 days.

(21) Appl. No.: 10/673,243

(22) Filed: Sep. 30, 2003

(65) Prior Publication Data

US 2004/0094764 A1 May 20, 2004

(30) Foreign Application Priority Data

Sep. 30, 2002 (JP) .............................. 2002-286136

(51) Int. Cl.
*H01L 29/04* (2006.01)
(52) U.S. Cl. ..................... 257/72; 257/59; 257/258; 257/291; 349/113
(58) Field of Classification Search ................. 257/72, 257/59, 258, 291; 349/113
See application file for complete search history.

(56) References Cited

U.S. PATENT DOCUMENTS

| | | | |
|---|---|---|---|
| 6,133,968 A | 10/2000 | Asada | |
| 6,862,057 B1 | 3/2005 | Sakamoto et al. | |
| 2002/0070454 A1* | 6/2002 | Yasukawa | 257/760 |
| 2002/0118331 A1 | 8/2002 | Sakamoto et al. | |

FOREIGN PATENT DOCUMENTS

| | | |
|---|---|---|
| JP | A 10-123508 | 5/1998 |
| JP | A 11-337935 | 12/1999 |
| JP | A 2000-047262 | 2/2000 |
| JP | A 2000-221494 | 8/2000 |
| JP | A 2000-284272 | 10/2000 |
| JP | A 2001-083538 | 3/2001 |
| JP | A 2001-154189 | 6/2001 |
| JP | A 2001-194662 | 7/2001 |
| JP | A 2001-215529 | 8/2001 |
| JP | A 2002-014211 | 1/2002 |
| JP | A 2002-196322 | 7/2002 |
| JP | A 2002-207214 | 7/2002 |
| JP | A 2002-214641 | 7/2002 |
| JP | A 2002-244126 | 8/2002 |
| JP | A 2002-258278 | 9/2002 |
| JP | A 2002-258320 | 9/2002 |
| JP | A 2003-149662 | 5/2003 |
| KR | A 2000-0011190 | 2/2000 |

* cited by examiner

*Primary Examiner*—Minhloan Tran
*Assistant Examiner*—Tan Tran
(74) *Attorney, Agent, or Firm*—Oliff & Berridge, PLC

(57) ABSTRACT

The invention provides an active matrix type electro-optical device and an electronic apparatus using the same capable of preventing interference of light due to contact holes and interference of reflecting light from light-reflecting film. In a thin film transistor (TFT) array substrate of a reflective active matrix type electro-optical device, a light-reflecting film can be formed in a contact hole, but positions of the contact holes for electrically connecting a pixel electrode to a drain electrode, and irregular pattern for scattering light formed on the surface of the reflection film by a lower side irregularity-formation film are different in each of pixels formed in a matrix.

9 Claims, 16 Drawing Sheets

(A)

(B)

Related Art

Related Art

ACTIVE MATRIX TYPE ELECTRO-OPTICAL DEVICE WITH PATTERNS OF CONTACT HOLE FORMATION-POSITIONS AND ELECTRONIC APPARATUS

BACKGROUND OF THE INVENTION

1. Field of Invention

The present invention relates to active matrix type electro-optical devices holding an electro-optical material on a substrate, and to an electronic apparatus using the same. More particularly, the invention relates to active matrix type reflective and transflective electro-optical devices.

2. Description of Related Art

Electro-optical devices including liquid crystal devices have been used as direct viewing type display devices of various equipments. As illustrated in FIGS. 17 and 18, in an active matrix type reflective liquid crystal device, a thin film transistor (TFT) 30 for pixel switching, an irregularity forming film 13a on which a plurality of irregularities consisting of protrusions or holes are dispersed, a light-reflecting film 8a formed on the irregularity forming film 13a, and a transparent pixel electrode 9a are formed in each of a plurality of pixels 100a arranged in a matrix on a surface of a TFT array substrate 10. Irregularities of the irregularity forming film 13a are reflected as an irregular pattern 8g on the surface of the light-reflecting film 8a. Accordingly, light incident from a counter substrate 20 is reflected by the TFT array substrate 10, and an image is displayed in a reflection mode by light emitted from the counter substrate 20.

Here, when light reflected by the light-reflecting film 8a has strong orientation, viewing angle range dependence increases remarkably. That is, brightness is dependent upon an angle of viewing the image. Conventionally, a photo-resist resin made of an organic resin, such as an acryl resin, is coated thickly on the surface of a second interlayer insulating film 5, and then a lower irregularity-formation film 13a including a plurality of irregularities consisting of protrusions or holes is formed from at the lower side of the light-reflecting film 8a by patterning the photo-resist resin by using a photolithography method. Thereafter, an upper side irregularity forming film 7a is formed on the surface of the lower irregularity-formation film 13a for the irregularities to become gentle, and the irregular pattern 8a for scattering light are formed gently on the surface of the light-reflecting film 8a formed on the upper side irregularity forming film 7a.

In such a TFT array substrate 10, when a drain of the pixel switching TFT 30 is electrically connected to a pixel electrode 9a, a drain electrode 6b is electrically connected through a contact hole 4c formed on a gate insulation film 2 and a first interlayer insulating film 4 to a drain region of the TFT 30 in the whole pixels 100a. In addition, the light-reflecting film 8a is electrically connected to the drain electrode 6b through a contact hole 5c formed on the second interlayer insulating film 5 and the upper side irregularity forming film 7a in a position substantially overlapping with the contact hole 4c. The pixel electrode 9a made of an indium tin oxide (ITO) film is electrically connected to the light-reflecting film 8a.

In such an electro-optical device, there was a problem in that if the irregular pattern 8g on the surface of the light-reflecting film 8a is formed identically in each pixel 100a, interference occurs with respect to the reflected light from the light-reflecting film 8a to reduce display quality. Therefore, it is preferable that the irregular pattern 8g be formed differently in each pixel 100a.

However, even if the irregular patterns 8g are formed differently in each pixel 100a, in the conventional electro-optical devices, formation positions of contact holes 5d become completely in the whole pixels 100a (for example, see Japanese Unexamined Patent Application Publication No. 10-123508).

As a result, the conventional electro-optical device has a disadvantage in that reflected light from the slanted surface of the wall of the contact holes 5d interferes in pixel units.

SUMMARY OF THE INVENTION

In consideration of the problems described above, an object of the present invention is to provide an active matrix type electro-optical device and an electronic apparatus which can prevent light interference due to the contact holes.

Another object of the present invention is to provide an active matrix type electro-optical device which can prevent interference of the reflected light from a light-reflecting film, and an electronic apparatus using the same.

To solve these problems, the present invention provides an active matrix type electro-optical device having, in each of a plurality of pixels arranged in a matrix on a substrate holding an electro-optical material, a thin film transistor for pixel switching, an irregularity forming film on which a plurality of irregularities consisting of protrusions or holes are dispersed, and a light-reflecting film formed on the irregularity forming film. The light-reflecting film having on its surface an irregular pattern for scattering light due to the irregularity forming film, and the light-reflecting film being formed in contact holes which are formed in an interlayer insulating film. When the pixels are grouped into a plurality of units of n×m pixels, the patterns of contact hole formation-position can be different in each of the units.

According to the present invention, patterns of the contact-hole formation position are different in each unit, and thus the contact holes are not repeated when the electro-optical device is viewed from any angle. Therefore, the reflected light from the light-reflecting film do not interfere due to the contact holes and their peripheral parts.

Preferably, in the present invention, contact-hole formation positions are different for each pixel in the unit.

Preferably, in the present invention, the contact-hole formation positions of the pixels located in the same positions in the units are different for each unit.

According to another aspect of the invention, an active matrix type electro-optical device can include, in each of a plurality of pixels arranged in a matrix on a substrate holding an electro-optical material, a thin film transistor for pixel switching, an irregularity forming film on which a plurality of irregularities consisting of protrusions or holes are dispersed, and a light-reflecting film formed on the irregularity forming film. The light-reflecting film having on its surface an irregular pattern for scattering light due to the irregularity forming film, and the light-reflecting film being formed in contact holes which are formed in an interlayer insulating film. When the plurality of pixels can be grouped into a plurality of units of n×m pixels, contact-hole formation positions are different for each unit.

According to the present invention, because the contact hole positions of each pixel are different, even if the contact hole formation patterns are identical in the units, light interference for one pixel period can be extended to a unit period. As a result, it is possible to prevent interference.

Preferably, in the present invention, the pixels have different patterns at least in the units, and irregular pattern positions are different in the units. According to the above structure, the same patterns are not repeated when the electro-optical device is viewed from any angle. Therefore, interference does not occur to the reflected light from the light-reflecting film.

According to another aspect of the invention, an active matrix type electro-optical device can include, in each of a plurality of pixels arranged in a matrix on a substrate holding an electro-optical material, a thin film transistor for pixel switching, an irregularity forming film on which a plurality of irregularities consisting of protrusions or holes are dispersed, and a light-reflecting film formed on the irregularity forming film. The light-reflecting film having on its surface an irregular pattern for scattering light due to the irregularity forming film, and the light-reflecting film being formed in contact holes which are formed in an interlayer insulating film. Contact-hole formation positions can be different in each of the pixels.

According to the present invention, patterns of the contact-hole formation position are different in each unit, and thus the contact holes are not repeated when the electro-optical device is viewed from any angle. Therefore, the reflected light from the light-reflecting film does not interfere due to the contact holes and their peripheral parts.

Preferably, in the present invention, the pixels have different patterns. Identical irregular pattern is not repeated when the electro-optical device is viewed from any angle. Therefore, interference does not occur to the reflected light from the light-reflecting film.

Preferably, in the present invention, a drain electrode is formed almost over the entire pixel at the lower side of the light-reflecting film in all of the pixels. Accordingly, even if the contact-hole formation positions are changed, drain electrode formation regions are not influenced.

Preferably, in the present invention, the contact holes formed in each pixel have the same area.

According to the present invention, an active matrix type electro-optical device is constructed such that liquid crystal is held as the electro-optical material between the substrate which is a first substrate and a second substrate facing the first substrate. Such an active matrix type electro-optical device is used as a display unit of electronic apparatuses such as cellular phones or mobile computers.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Hereinafter, embodiments of the present invention will be explained with reference to the accompanying drawings.

Figure 1:
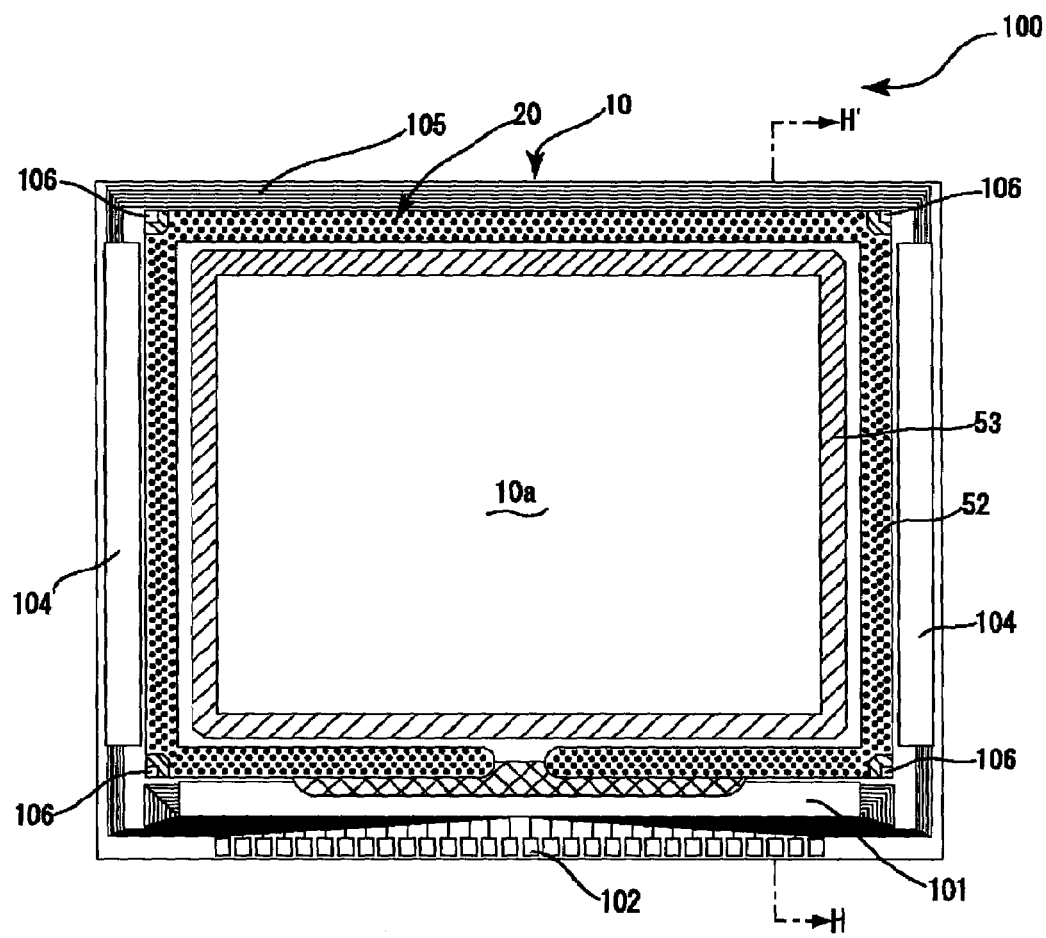
FIG. 1 is a plan view illustrating an active matrix type electro-optical device when seen from a counter substrate side.
Figure 2:
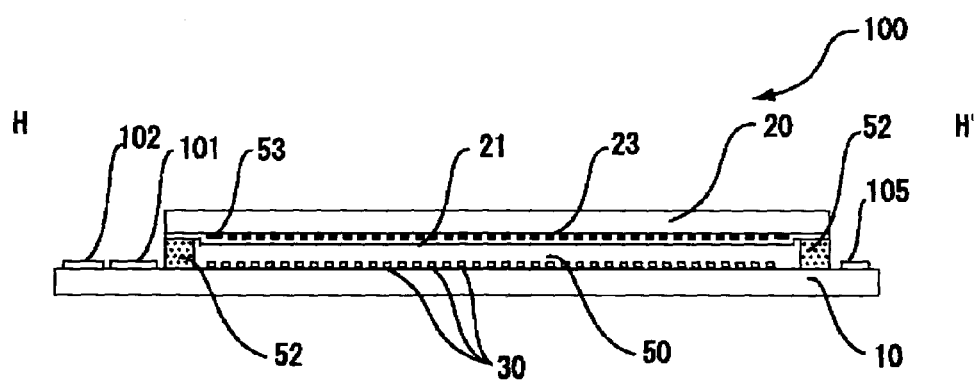
FIG. 2 is a cross-sectional view taken along the line H–H' of FIG. 1.
Figure 3:
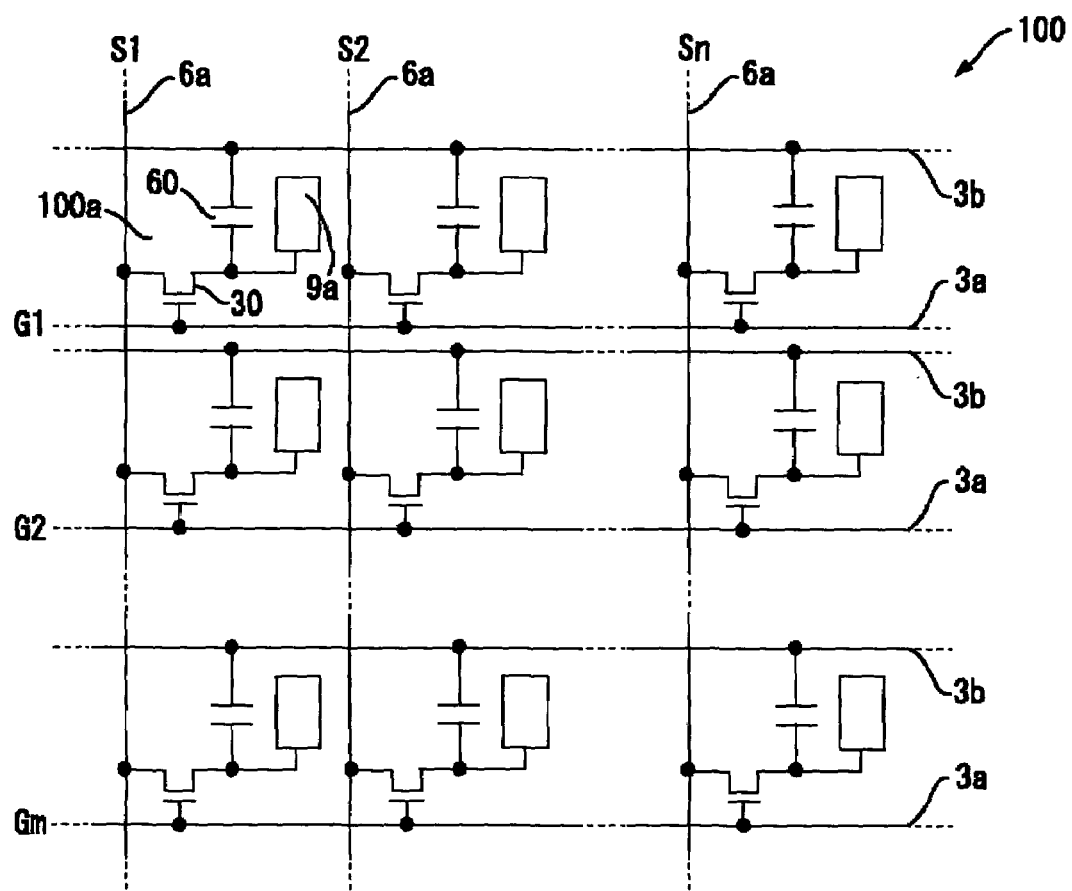
FIG. 3 is an equivalent circuit diagram illustrating various elements and wires formed in a plurality of pixels arranged in a matrix in the active matrix type electro-optical device.

FIG. 1 is an exemplary plan view illustrating structural elements of an electro-optical device to which the present invention is applied seen from a counter substrate side, FIG. 2 is a cross-sectional view taken along the line H–H' of FIG. 1, and FIG. 3 is an equivalent circuit diagram illustrating various elements and wires of a plurality of pixels arranged in a matrix in an image display region of the electro-optical device. In the drawings used for the explanation of the embodiments, scales of each of layers and members are varied so as to make the size of each of layers and members recognizable in the drawings.

Referring to FIGS. 1 and 2, in an electro-optical device 100 (liquid crystal device) according to the embodiment, a TFT array substrate 10 (first substrate) and a counter substrate 20 (second substrate) are bonded by using a sealing material 52, and liquid crystal 50 which is an electro-optical material is interposed between regions (liquid crystal sealing region) divided by the sealing material 52. A peripheral partition 53 made of a light shielding material can be formed in the inside region of a formation region of the sealing material 52. A data line driving circuit 101 and a mounting terminal 102 can be formed in an outside region of the sealing material 52 along one side of the TFT array substrate 10, and a scanning line driving circuit 104 is formed along two sides adjacent to the side. A plurality of wires 105 for connecting the scanning line driving circuits 104 provided at both sides of the image display region is formed along the remaining side of the TFT array substrate 10. In addition, a precharge circuit or test circuit can be provided by using the lower side of the peripheral partition 53. An inter-substrate connecting material 106 for electrically connecting the TFT array substrate 10 to the counter substrate 20 is formed in at least one corner of the counter substrate 20.

For example, a TAB (tape automated bonding) substrate on which a driving LSI is mounted can be electrically mechanically connected to a terminal group formed at the periphery of the TFT array substrate 10 through an anisotropic conductive film, instead of forming the data line driving circuit 101 and the scanning line driving circuits 104 on the TFT array substrate 10. A polarization film, a retardation film and a polarization plate are aligned in a certain direction of the electro-optical device 100 according to a type of liquid crystal 50, namely an operation mode such as a TN (twisted nematic) mode and STN (super TN mode), or a normally white mode/normally black mode, which are not illustrated herein.

When the electro-optical device 100 is intended to display colors, RGB color filters and their protection films are formed in a region of the counter substrate 20 facing pixel electrodes (described hereinlater) of the TFT array substrate 10.

As illustrated in FIG. 3, a plurality of pixels 100a are formed in a matrix in the image display region of the electro-optical device 100 having above-described configuration. A pixel electrode 9a and a pixel switching TFT 30 for driving the pixel electrode 9a are formed in each of the pixels 100a. Data lines 6a for supplying pixel signals S1, S2, . . . , Sn are electrically connected to sources of the TFTs 30. The pixel signals S1, S2, . . . , Sn recorded on the data lines 6a can be line-sequentially supplied in this order, or be supplied to the plurality of data lines 6a which are adjacent to each other in group units. Scanning lines 3a are electrically connected to gates of the TFTs 30. Scanning signals G1, G2, . . . , Gm are line-sequentially applied in this order to the scanning line 3a at a predetermined timing in a pulsed way. The pixel electrodes 9a are electrically connected to drains of the TFTs 30, for turning on the TFT 30 functioning as a switching element for a predetermined time, to record the pixel signals S1, S2, . . . , Sn from the data lines 6a on each pixel at a predetermined timing. In this regard, the pixel signals S1, S2, . . . , Sn of predetermined level recorded on the liquid crystal through the pixel electrodes 9a are held between the counter substrate 20 of FIG. 2 and a counter electrode 21 for a predetermined time.

Here, the orientation or order of molecular groups of the liquid crystal 50 is varied in accordance with an applied voltage level, to modulate light and display a grayscale. In the normally white mode, an amount of incident light passing through the liquid crystal 50 decreases in accordance with the applied voltage level. In the normally black mode, an amount of incident light passing through the liquid crystal 50 increases in accordance with the applied voltage level. As a result, light having a contrast according to the pixel signals S1, S2, . . . , Sn is emitted from the electro-optical device 100.

In order to prevent leakage of the held pixel signals S1, S2, . . . , Sn, storage capacitors 60 can be added in parallel to the liquid crystal capacitors formed between the pixel electrodes 9a and the counter electrodes 21. For example, the voltage of the pixel electrode 9a is held by the storage capacitors 60 for a longer time than a transmission time of the source voltage by three digits. Accordingly, a holding property of electric charges is improved to embody a high contrast ratio of electro-optical device 100. As shown in FIG. 3, the storage capacitor 60 can be formed between the liquid crystal capacitors and capacitive lines 3b which are a wire for forming the storage capacitors 60 or preceding scanning lines 3a.

Figure 4:
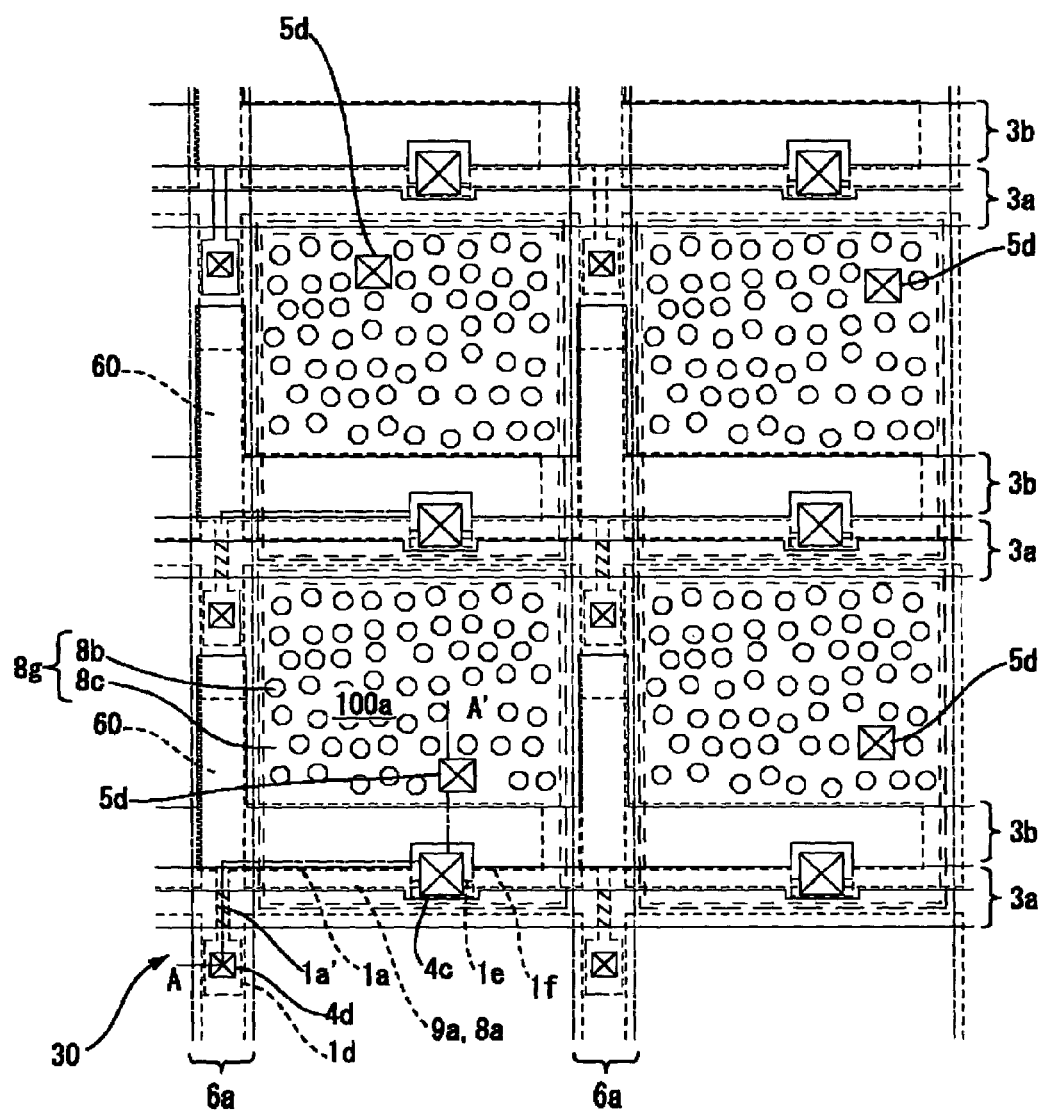
FIG. 4 is a plan view illustrating the construction of the pixels formed on a TFT array substrate in the active matrix type electro-optical device to which the present invention is applied.
Figure 5:
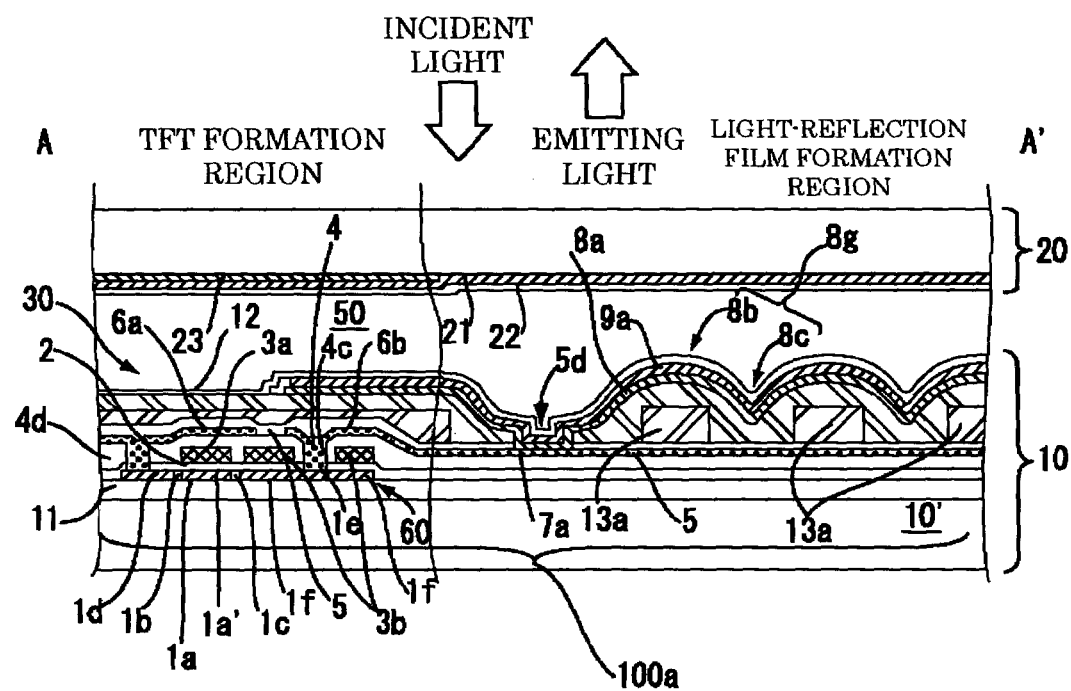
FIG. 5 is a cross-sectional view illustrating the pixels which are cut at a position corresponding to the line A–A' of FIG. 4.

FIG. 4 is a plan view illustrating the plurality of pixel groups which are adjacent to each other formed on the TFT array substrate used in the active matrix type electro-optical device, and FIG. 5 is a cross-sectional view illustrating part of pixels of electro-optical device cut in a position corresponding to the line A–A' of FIG. 4.

As depicted in FIG. 4, pixel electrodes 9a made of a plurality of transparent ITO films are formed in a matrix on the TFT array substrate 10, and pixel switching TFTs 30 are connected to each of the pixel electrodes 9a, respectively. In addition, the data lines 6a, scanning lines 3a and capacitive lines 3b are formed along the perpendicular and horizontal boundaries of the pixel electrodes 9a. The TFTs 30 are connected to the data line 6a and the scanning lines 3a. The scanning lines 3a are extended to face channel regions 1a' of the TFTs 30.

The data lines 6a are electrically connected to heavily doped source regions 1d of the TFTs 30 through contact holes 4d, the pixel electrodes 9a are electrically connected to the drain electrodes 6b of the TFTs 30 through contact holes 5d, and the drain electrodes 6b are electrically connected to heavily doped drain regions 1e of the TFTs 30 through contact holes 4c.

In this embodiment, the drain electrodes 6b are formed almost over the entire pixel, and the contact holes 5d are formed in a predetermined region in which the drain regions 6b have been formed.

The storage capacitors 60 (storage capacitor elements) have a structure that a conductive extended part If of a semiconductor film 1 for forming the pixel switching TFT 30 as a lower electrode 41 overlaps with the capacitive line 3b positioned on the same layer as the scanning line 3a as an upper electrode.

As shown in FIG. 5, in a cross-section of a pixel 100a taken along the line A–A', a base protection film 11 made of silicon oxide film (insulation film) with a thickness of 300 nm to 500 nm is formed on the surface of a transparent substrate 10' which is a base of the TFT array substrate 10. An island shaped semiconductor film 1a with a thickness of 50 nm to 100 nm is formed on the surface of the base protection film 11. A gate insulation film 2a made of silicon oxide film with a thickness of 50 to 150 nm is formed on the surface of the semiconductor film 1a, and a scanning line 3a with a thickness of 300 nm to 800 nm is formed on the surface of the gate insulation film 2a as a gate electrode. A region of the semiconductor film 1a facing the scanning line 3a through the gate insulation film 2a is a channel region 1a'.

A source region having a lightly doped source region 1b and a heavily doped source region 1d is formed at one side of the channel region 1a', and a drain region having a lightly doped drain region 1c and a heavily doped drain region 1e is formed at the other side of the channel region 1a'.

A first interlayer insulating film 4 made of silicon oxide film with a thickness of 300 nm to 800 nm and a second interlayer insulating film 5 (surface protection film) made of silicon nitride film with a thickness of 100 nm to 300 nm are formed on the surface of the pixel switching TFT 30. A data line 6a with a thickness of 300 nm to 800 nm is formed on the surface of the first interlayer insulating film 4, and the data line 6a is electrically connected to the heavily doped source region 1d through the contact hole 4d formed on the first interlayer insulating film 4.

A drain electrode 6b formed simultaneously with the data line 6a is formed on the surface of the first interlayer insulating film 4, and electrically connected to the heavily doped drain region 1e through the contact hole 4c formed on the first interlayer insulating film 4.

A lower irregularity-formation film 13a made of a photoresist resin, such as an organic resin, and an upper side irregularity forming film 7a made of polysilazane or organic resin are formed sequentially on the second interlayer insulating film 5. A light-reflecting film 8a made of an aluminum film and the like is formed on the surface of the upper irregularity-formation film 7a.

A transparent pixel electrode 9a made of an ITO film is formed on the light-reflecting film 8a. The pixel electrode 9a is directly stacked on the light-reflecting film 8a to be electrically connected to the light-reflecting film 8a.

Here, the light-reflecting film 8a is formed in the contact hole 5d formed in the upper side irregularity forming film 7a and the second interlayer insulating film 5, and electrically connected to the drain electrode 6b through the contact hole 5d. In addition, the pixel electrode 9a made of an ITO film is electrically connected to the drain electrode 6b through the light-reflecting film 8a.

The drain electrode 6b of the TFT 30 is formed almost over the whole pixel 100a at the lower side of the light-reflecting film 8a. In this regard, as described in greater detail below, even if positions of contact hole 5d are changed in each pixel 100a, formation positions or ranges of the drain electrodes 6b are not influenced. Moreover, even if the drain electrode 6b is formed in a wide range, an amount of light for display is not reduced at the lower side of the light-reflecting film 8a.

An alignment film 12 made of a polyimide film is formed on the surface of the pixel electrode 9a. The alignment film 12 is obtained by rubbing the polyimide film.

A capacitive line 3b positioned at the same layer as the scanning line 3a is formed as an upper electrode to face the extended part 1f (lower electrode) from the heavily doped drain region 1e through an insulation film (dielectric film) which is simultaneously formed with a gate insulation film 2a, to form an storage capacitor 60.

Preferably, the TFT 30 has the LDD structure as described above, but may have an offset structure which does not implant impurity ions into the regions corresponding to the lightly doped source region 1b and the lightly doped drain region 1c. The TFT 30 may be a self-aligned TFT which forms heavily doped source and drain regions according to selfalignment by implanting heavily doped impurity ions by using the gate electrode (part of scanning line 3a) as a mask.

This embodiment has a single gate structure in which the gate electrode (scanning line 3a) of the TFT 30 is arranged between the source and drain regions. However, two or more gate electrodes can be arranged between the source and drain regions. Here, identical signals are supplied to the respective gate electrodes. When the TFT 30 is formed of a dual gate (double gate) or triple or more gate structure, leakage current is prevented in the junction of the channel and the source and drain regions, to reduce current consumption in a turning-off state. When at least one the gate electrode is formed in an LDD or offset structure, turning-off current can be considerably reduced, to be able to obtain a stabilized switching device.

As shown in FIGS. 4 and 5, in the TFT array substrate 10, the irregular pattern 8g having convex units 8b and concave units 8c are formed in a region (light-reflecting film formation region) which is not included in the formation region of the TFT 30 on the surface of the light-reflecting film 8a in the reflection region of each pixel 100a. In order to form such an irregular pattern 8g, on the TFT array substrate 10 according to the present embodiment, the lower irregularity-formation films 13a made of an organic photoresist resin are formed with a predetermined interval on the second interlayer insulating film 5 as a plurality of columnar protrusions (prominences and depressions) in a region overlapping with the light-reflecting film 8a over a plane below the light-reflecting film 8a. The upper side irregularity forming film 7a made of an insulating film which is formed of fluidity material, such as polysilazane or organic resin, is stacked on the lower irregularity-formation film 13a. Therefore, the irregular patterns 8g corresponding to the irregularities of the lower irregularity-formation film 13a are formed on the surface of the reflection film 8a. Edges of the lower irregularity-formation film 13a are not protruded from the irregular pattern 8g by the upper side irregularity forming film 7a.

In addition, instead of forming the upper side irregularity forming film 7a, by performing a baked process after forming the lower irregularity-formation film 13a, the edges of the irregularities of the lower irregularity-formation film 13a may be formed to become gentle.

Here, the columnar protrusions forming the irregularities of the irregularity forming film 13a are formed in a circular or polygonal plane shape. The columnar protrusions forming the irregularities of the lower irregularity-formation film 13a have different types having different plane sizes, but are illustrated to have the same size in FIGS. 4 and 5. The shape, size and distribution of the irregular pattern 8g are determined by the shape, size and distribution of the lower irregularity-formation film 13a composing the columnar protrusions.

Referring to FIG. 5, on the counter substrate 20, the light shielding film 23, called as a black matrix or black stripe, is formed in the regions facing the perpendicular and horizontal boundaries of the pixel electrodes 9a formed on the TFT array substrate 10. The counter electrode 21 made of an ITO film is formed on the light shielding film 23. The alignment film 22 made of a polyimide film is formed on the counter electrode 21. The alignment film 22 is formed by rubbing the polyimide film.

Figure 6:
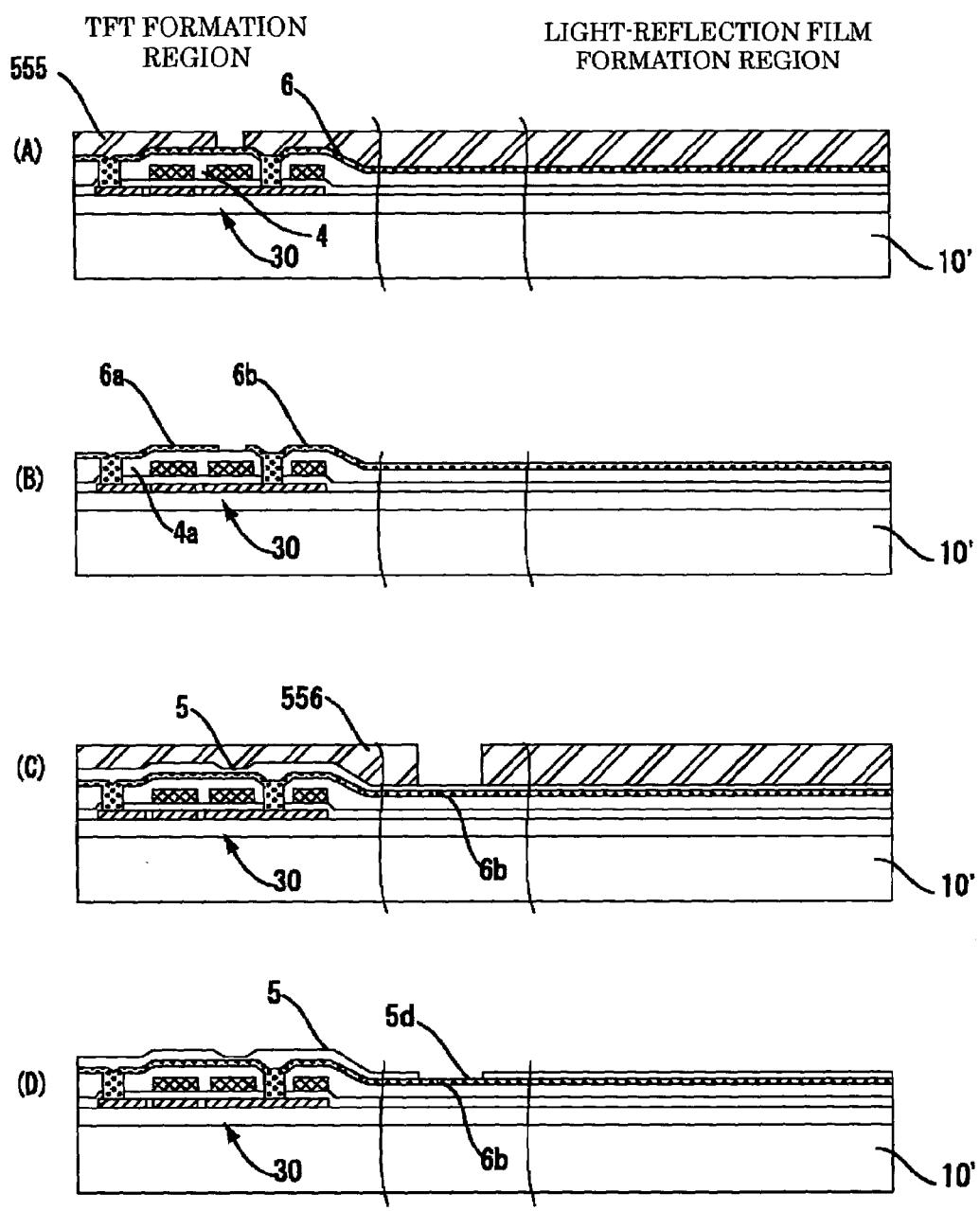
FIGS. 6(A) to (D) are cross-sectional views illustrating sequential steps of a method for manufacturing a TFT array substrate of the active matrix type electro-optical device to which the present invention is applied.
Figure 7:
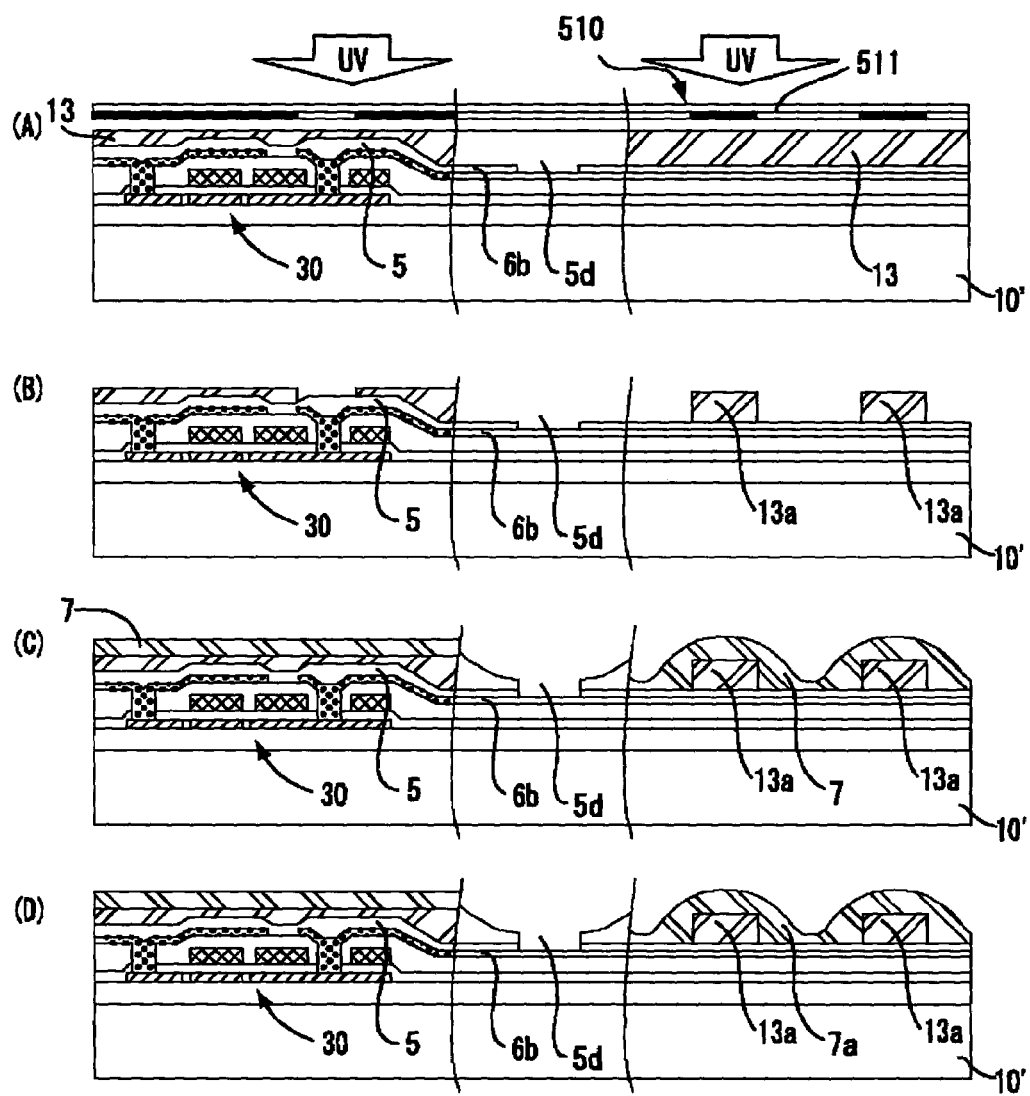
FIGS. 7(A) to (D) are cross-sectional views illustrating processes succeeding to the process of FIG. 6, in the method for manufacturing the TFT array substrate of the active matrix type electro-optical device to which the present invention is applied.
Figure 8:
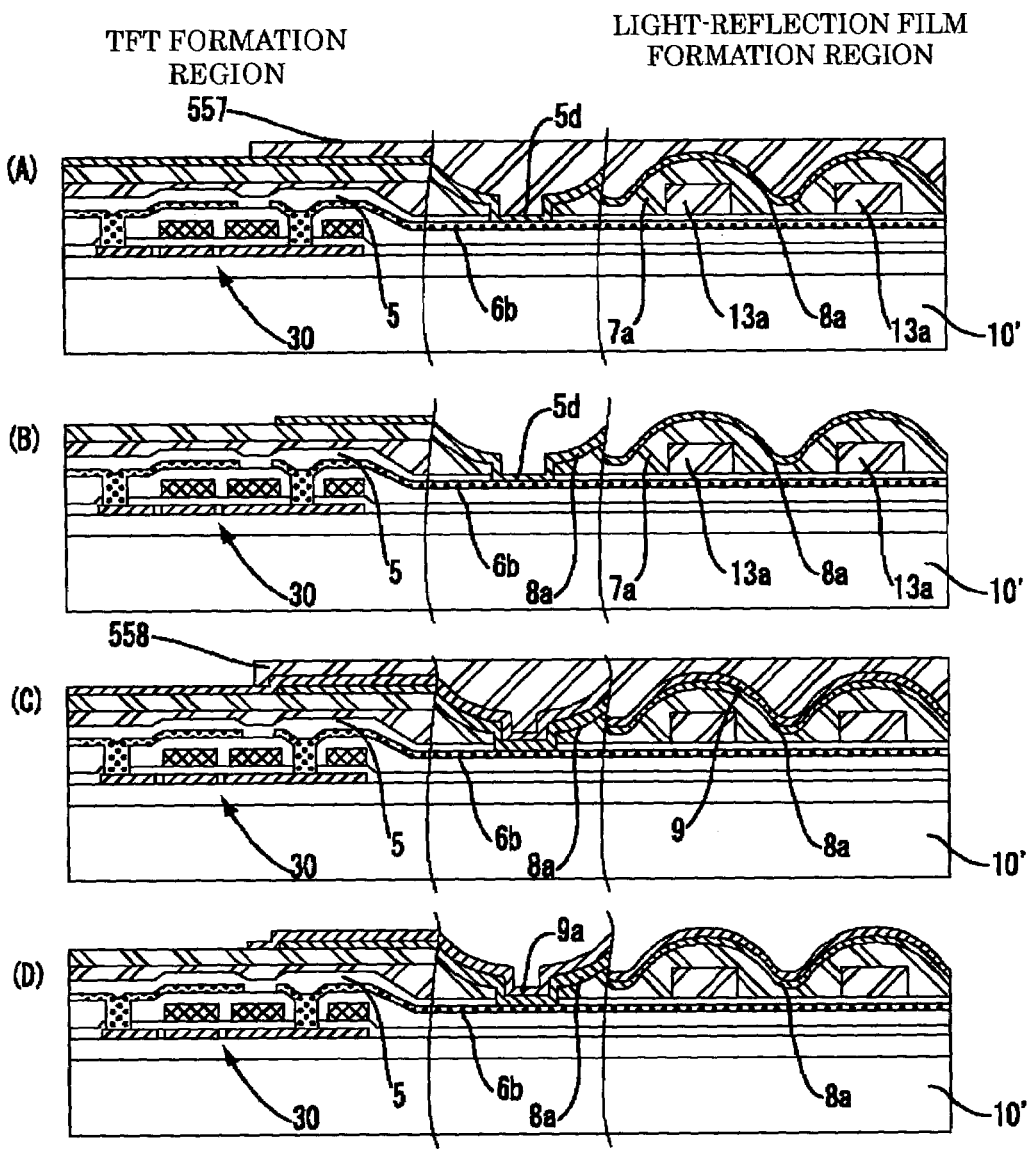
FIGS. 8(A) to (D) are cross-sectional views illustrating sequential steps of a method for manufacturing a TFT array substrate of the active matrix type electro-optical device to which the present invention is applied.

A method for manufacturing the TFT array substrate 10 will be explained with reference to FIGS. 6 to 8. FIGS. 6 to 8 are cross-sectional views illustrating sequential steps of the method for manufacturing the TFT array substrate 10, and especially illustrating sections of the TFT formation region and the light-reflecting film formation region.

When the TFT array substrate 10 of this embodiment is manufactured, a method referred as a low temperature process is adopted to form the TFT 30. This process has been well known, and thus only the steps relating to the characteristics of the TFT array substrate 10 of this embodiment will be explained.

As depicted in FIG. 6(A), in order to manufacture the TFT array substrate 10 of this embodiment, the TFT 30 is formed on the surface of the substrate 10 such, as a glass, a conductive film 6 composing the data lines 6a (source electrode) and the like is formed on the surface of the first interlayer insulating film 4 with a thickness of 300 nm to 800 nm by using a sputtering method, and then a resist mask 555 is formed by using a photolithography method. The conductive film 6 is made of an aluminum film, a tantalum film, a molybdenum film or an alloy film containing any of the above metal films as a main element.

Subsequently, a dry etching process is performed on the conductive film 6 by the resist mask 555, and the data line 6a and the drain electrode 6b are formed as shown in FIG. 6(B).

As illustrated in FIG. 6(C), the second interlayer insulating film 5 made of a silicon nitride film is formed with a thickness of 100 nm to 300 nm on the surfaces of the data line 6a and the drain electrode 6b by using a CVD method, and a resist mask 556 for forming the contact hole on the second interlayer insulating film 5 is formed by using a photolithography method.

A dry etching process is performed on the second interlayer insulating film 5 by the resist mask 556, and the contact hole 5d is formed in the region of the second interlayer insulating film 5 corresponding to the drain electrode 6b as shown in FIG. 6(D).

As shown in FIG. 7(A), the organic photoresist resin 13 is coated thick on the surface of the second interlayer insulating film 5, and exposed by an exposure mask 510. Here, a negative or positive resin can be used as the photoresist resin 13, but in FIG. 7(A), the positive type resin is used as the photoresist resin 13. Ultraviolet rays are irradiated to a portion where the photoresist resin 13 is desired to be removed through a light-transmitting part 511 of the exposure mask 510.

As depicted in FIG. 7(B), the lower irregularity-formation films 13a having the columnar protrusions and the contact hole 5d as explained with reference to FIG. 5 are formed in the region overlapping with the light-reflecting film 8a over a plane at the lower side of light-reflecting film 8a by developing the exposed photoresist resin 13.

As illustrated in FIG. 7(C), perhydro polysilazane or a composition containing the same is coated on the surfaces of the second interlayer insulating film 5 and the lower irregularity-formation films 13a, and then is baked. Otherwise, as shown in FIG. 7(D), a material 7 having fluidity, such as an organic resin is coated, patterned by using a photolithography method, or exposed and developed to form the upper side irregularity forming film 7a having the contact hole 5d.

Here, perhydro polysilazane is a kind of organic polysilazane which is an application type coating material and is transformed into a silicon oxide film by being baked in atmosphere. For example, polysilazane of Tonen Corp. is an inorganic polymer including —(SiH$_2$ NH)— as a unit, and is soluble in an organic solution such as xylene. Accordingly, when polysilazane is coated by a spin coating method (for example, at 2000 rpm, for 20 seconds) by using an organic solvent solution (20% xylene solution) of the inorganic polymer as a coating solution and baked in atmosphere at 450° C., it reacts with moisture or oxygen, therefore a fine amorphous silicon oxide film equivalent to or more than a silicon oxide film formed by a CVD process can be obtained.

Here, the upper side irregularity forming film 7a is formed by coating a material having fluidity. Thus, gentle irregular pattern 8g without edges is formed on the surface of the upper side irregularity forming film 7a by moderately smoothing the irregularities of the lower irregularity-formation film 13a.

In order to form the gentle irregular pattern 8g without forming the upper side irregularity forming film 7a, a bake process is performed as shown in FIG. 7(B), to make gentle the edges of the lower irregularity-formation film 13a.

Referring to FIG. 8(A), the metal film 8 having reflectivity, such as an aluminum film, is formed on the surface of the upper side irregularity forming film 7a by a sputtering method, and then a resist mask 557 is formed by using a photolithography method.

An etching process is performed on the metal film 8 by the resist mask 557. As shown in FIG. 8(B), the light-reflecting film 8a is left in a certain region. Irregular patterns 8g of 500 nm and above or 800 nm and above are formed on the surface of the light-reflecting film 8a by the lower irregularity-formation film 13a. In addition, the irregular pattern 8g becomes gentle without edges due to the upper side irregularity forming film 7a.

As depicted in FIG. 8(C), ITO film 9 having a thickness of 40 nm to 200 nm is formed on the surface of the light-reflecting film 8a by using a sputtering method, followed by forming a resist mask 558 by using a photolithography method.

An etching process is performed on the ITO film 9 by the resist mask 558. As illustrated in FIG. 8(D), the pixel electrode 9a is formed to be electrically connected to the drain electrode 6b through the contact hole 5d.

As shown in FIG. 5, the polyimide film (alignment film 12) is then formed on the surface of the pixel electrode 9a. In this regard, polyimide varnish prepared by dissolving 5 to 10 wt % of polyimide or polyamide acid in solvent such as butyl cellosolve or n-methyl pyrrolidone is flexo-printed, then heated and hardened (baked). The substrate on which the polyimide film has been formed is rubbed by a puff cloth including rayon fibers in a certain direction, so that polyimide molecules can be aligned in a certain direction near the surface. As a result, liquid crystal molecules can be arranged in a certain direction due to interreaction between the filled liquid crystal molecules and polyimide molecules. Thus, manufacturing of the TFT array substrate 10 is finished.

Figure 9:
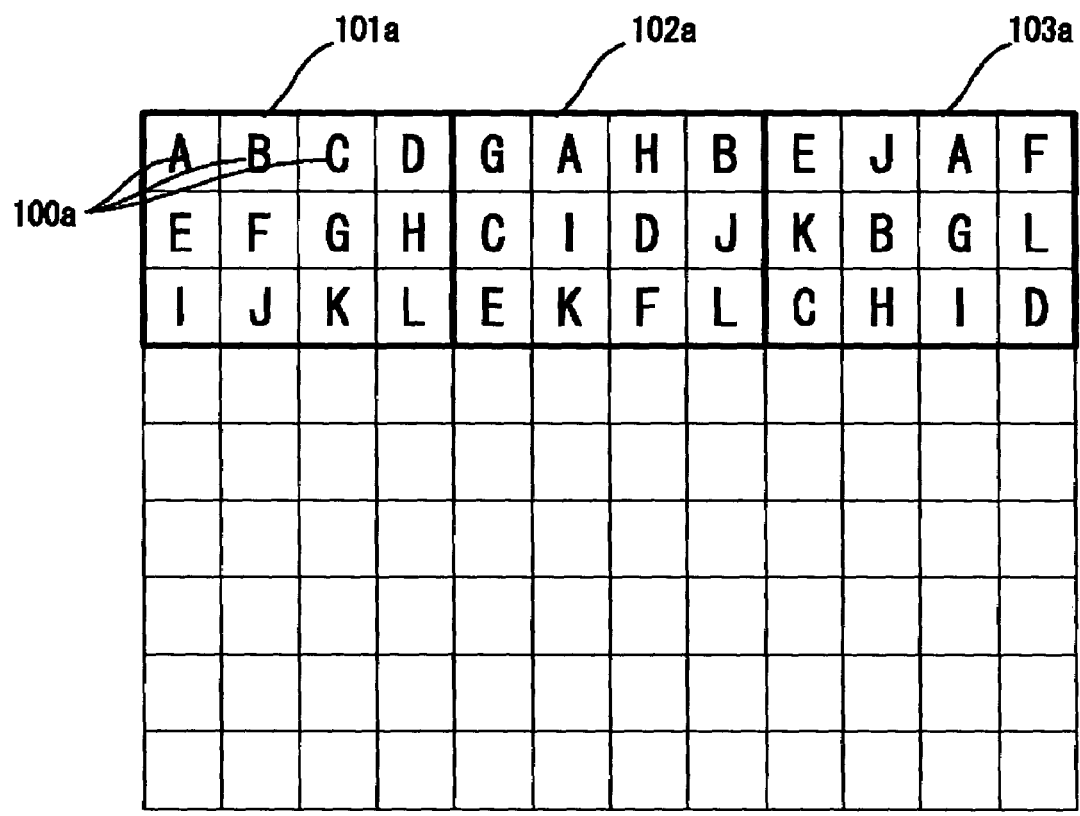
FIG. 9 is an explanatory diagram illustrating a process of arranging different irregular pattern in each unit of the pixels and forming contact holes in different positions in the active matrix type electro-optical device to which the present invention is applied.
Figure 10:
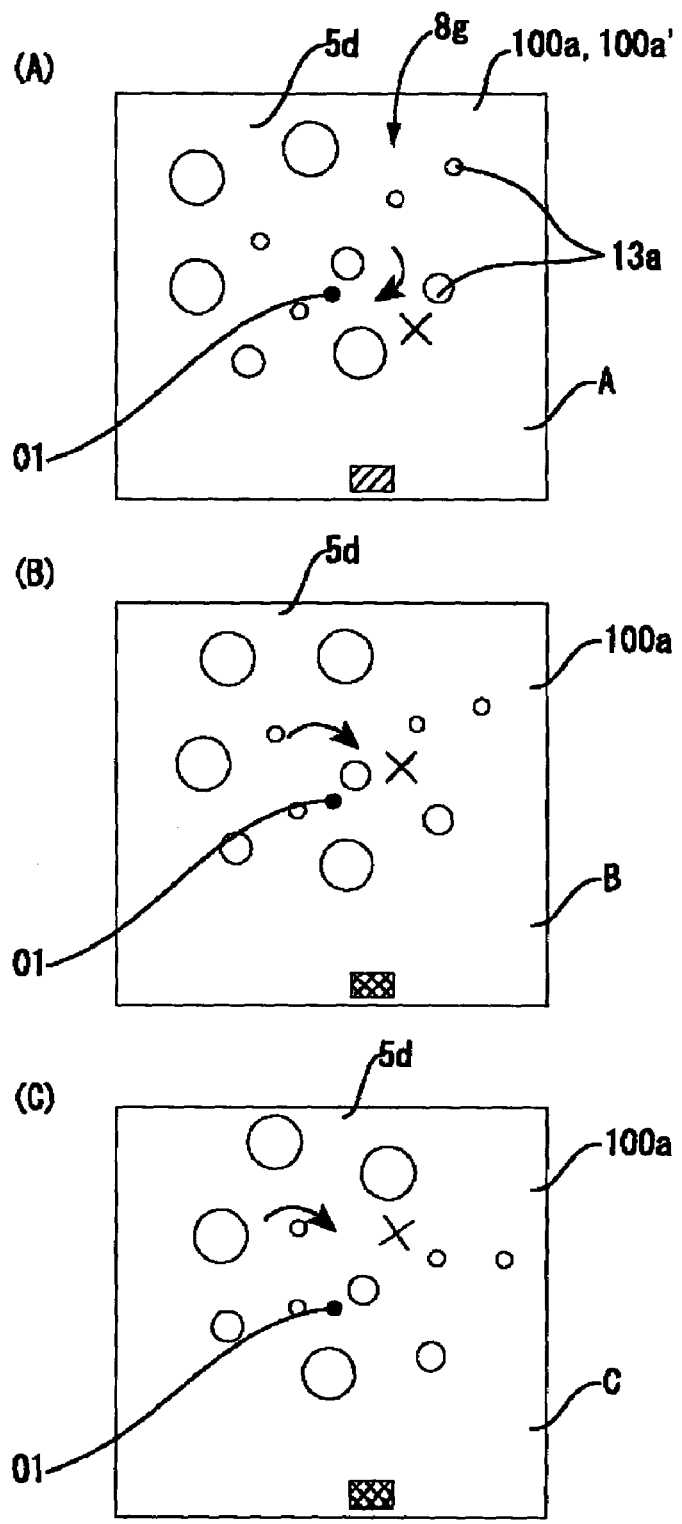
FIG. 10 is an explanatory diagram illustrating differences of irregular pattern formed on the pixels and contact-hole formation positions in the active matrix type electro-optical device to which the present invention is applied.
Figure 11:
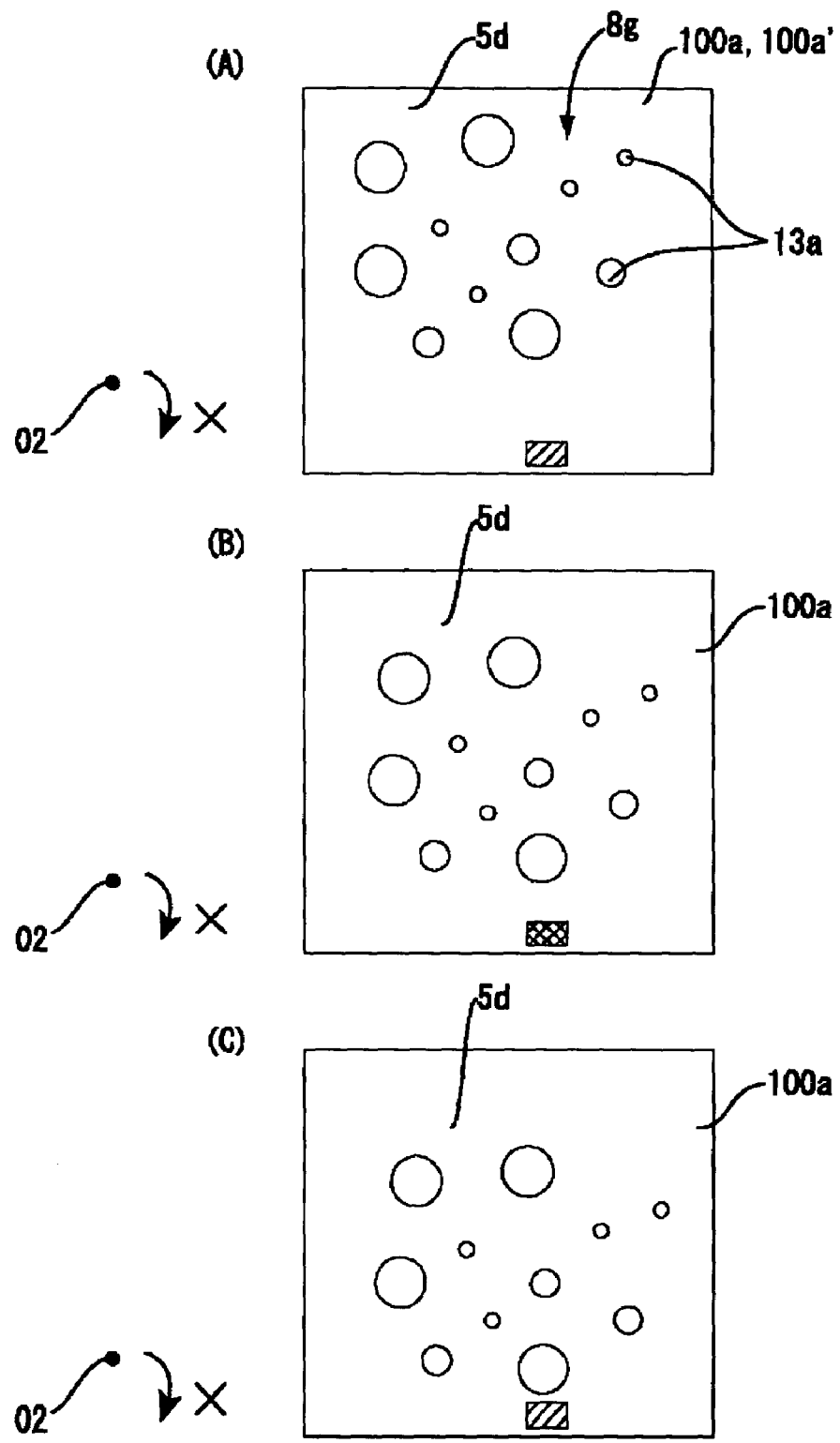
FIG. 11 is an explanatory diagram illustrating differences of irregular pattern formed on the pixels and contact-hole formation positions in the active matrix type electro-optical device to which the present invention is applied.
Figure 12:
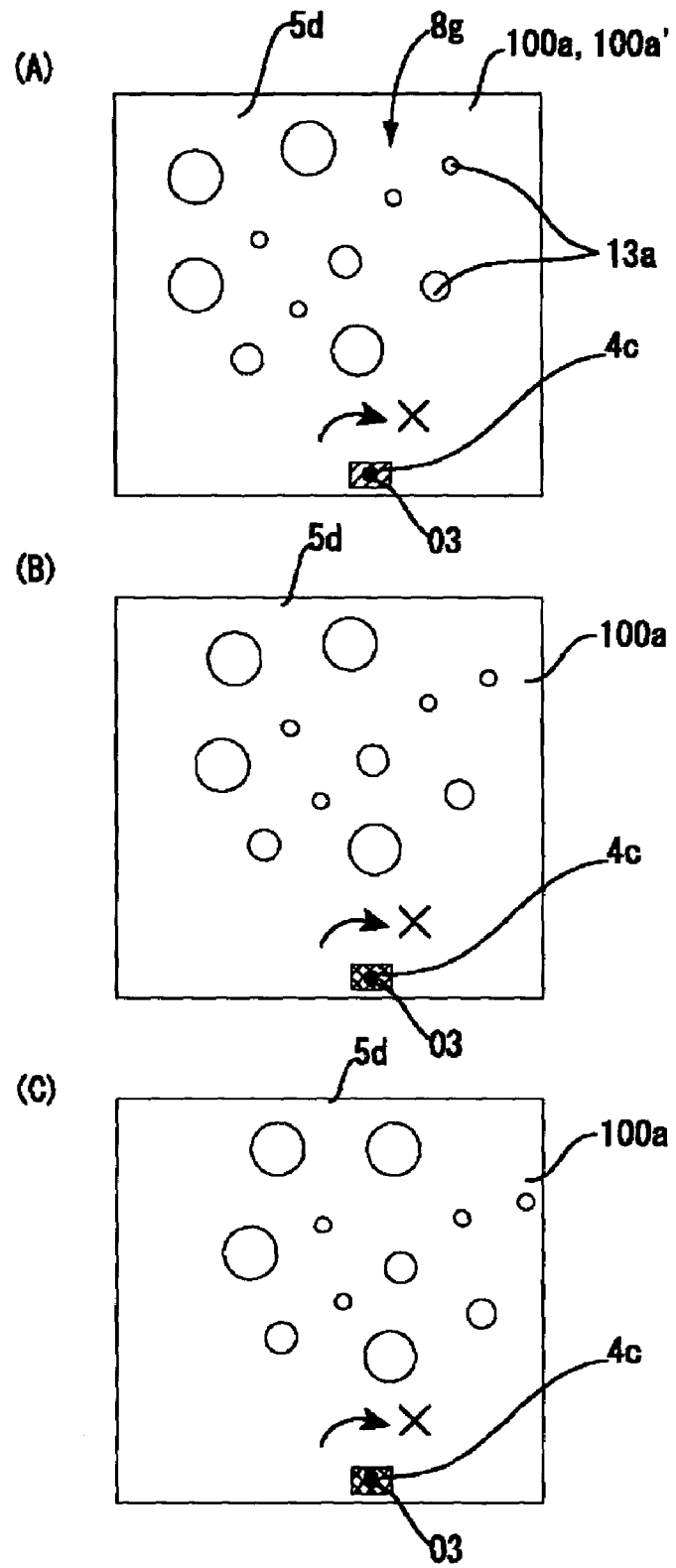
FIG. 12 is an explanatory diagram illustrating differences of irregular pattern formed on the pixels and contact-hole formation positions in the active matrix type electro-optical device to which the present invention is applied.
Figure 13:
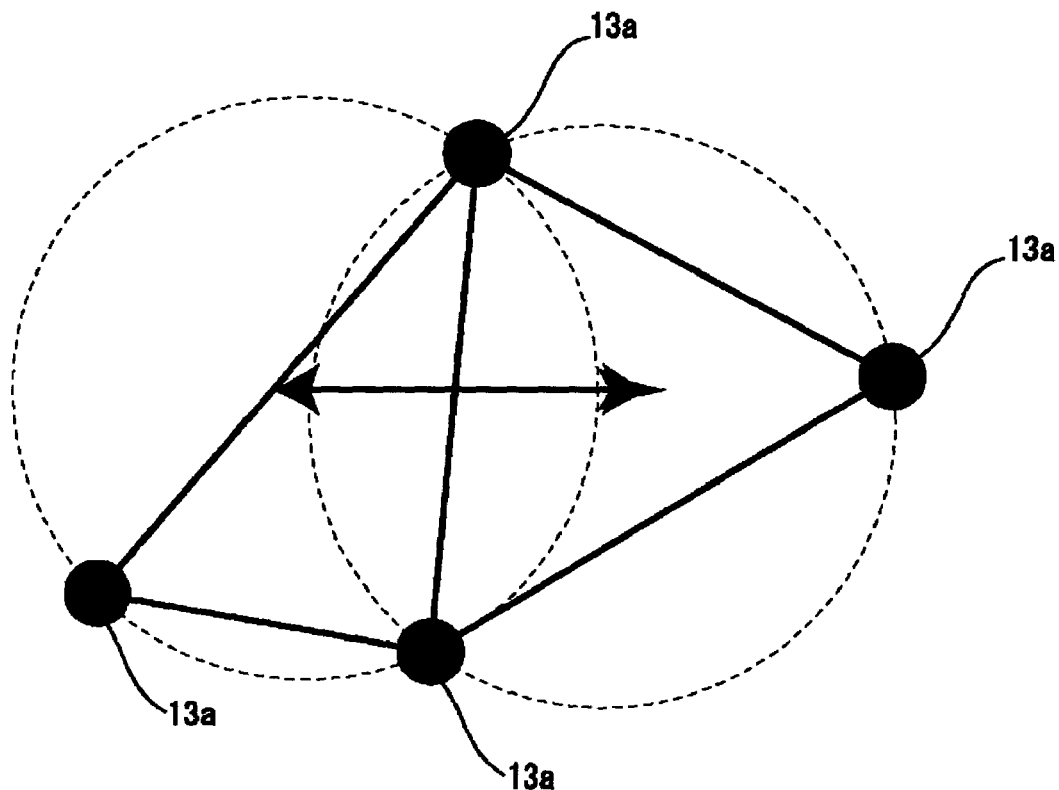
FIG. 13 is an explanatory diagram illustrating Delaunay triangle for measuring relative distance relations of irregularities.

FIG. 9 is an explanatory diagram illustrating the condition in which, when the plurality of pixels are grouped into a plurality of units on the TFT array substrate, irregular pattern shapes are different for the pixels at least in the units, and irregular pattern positions are different in the units. FIGS. 10 to 12 are explanatory diagrams illustrating the irregular pattern adhered to the TFT array substrate of the active matrix type electro-optical device according to the embodiment. FIG. 13 is an explanatory diagram illustrating Delaunay diagram for measuring relative distance relations of the irregularities.

In the active matrix type electro-optical device 100 in this embodiment, the light-reflecting film 8a made of an aluminum film is formed at the lower side of the pixel electrode 9a. Accordingly, light incident from the counter substrate 20 can be reflected by the TFT array substrate 10, and emitted from the counter substrate 20. Here, when optical modulation is performed on each pixel 100a by the liquid crystal 50, a desired image is displayed by using external light (reflection mode).

In this embodiment, the lower irregularity-formation film 13a is formed in the region at the lower side of the light-reflecting film 8a where the lower irregularity-formation film 13a overlaps therewith over a plane, and the irregular pattern 8g for scattering light is formed on the surface of the light-reflecting film 8a by using irregularities corresponding to the lower irregularity-formation film 13a. In addition, edges of the lower irregularity-formation film 13a are not protruded from the irregular pattern 8g by the upper side irregularity forming film 7a. Therefore, when an image is displayed in the reflection mode, an image is displayed by using scattering the reflected light. As a result, viewing angle range dependence is reduced.

However, when the irregular pattern 8g on the light-reflecting film 8a is identical in each pixel 100a, the reflected light from the light-reflecting film 8a interferes.

As shown in FIG. 9, the plurality of pixels 100a formed in a matrix are grouped into n×m pixels in multiple units 10la, 102a, 103a, . . . and the irregular pattern 8g are formed in different shapes in each pixel 100a at least in the units 10la, 102a, 103a, . . . .

That is, when the lower irregularity-formation film 13a is formed in each pixel 100a, an exposure mask 510 is designed to form irregular pattern 8g (irregular pattern A to L) by varying the shape, size and distribution of the columnar protrusions (prominences and depressions) formed by the lower irregularity-formation film 13a in the pixels 100a of the units 10la, 102a, 103a, . . . .

Here, the irregularities have a different plane size, but are illustrated to have the same size in FIGS. 4 and 5.

Positions of the irregular pattern A to L are different in the units 101a, 102a, 103a, . . . . For example, in the first unit 101a, the irregular pattern A, the irregular pattern B, the irregular pattern C, . . . are formed from the left to right direction of the top end, in the second unit 102a, the irregular pattern G, the irregular pattern A, the irregular pattern H, . . . are formed from the left to right direction of the top end, and in the third unit 103a, the irregular pattern E, the irregular pattern J, the irregular pattern A, . . . are formed from the left to right direction of the top end.

In order to form the plurality of irregular pattern, when the exposure mask 510 of FIG. 7(A) is designed, for example, the pixel 100a of FIG. 10(A) is designated as a reference pixel 100a', and the irregularities of the irregular pattern A formed in the reference pixel 100a' are rotated on a certain position O1 of the pixel region as indicated by an arrow X, to form the irregular pattern B, C, . . . of FIGS. 10(B) and (C) in the other pixels 100a. As a result, different irregular pattern 8g are formed in each pixel 100a.

Here, the rotation center O1 is set in the pixel region. In this case, the rotation center is preferably set in a position deviated from the center of the lower irregularity-formation film 13a composing the irregularities. In addition, the rotation center is preferably set in a position deviated from the circular shape defining the outer circumference of the lower irregularity-formation film 13a. Accordingly, if determined as mentioned above, it is possible to prevent the lower irregularity-formation film 13a from being formed in the rotation center region in each irregular pattern A to L. The rotation center can be moved while the irregularities are rotated on the position O1.

When the exposure mask 510 is designed, for example, the pixel 100a of FIG. 11(A) is designated as a reference pixel 100a', and the irregularities of the irregular pattern A formed in the reference pixel 100a' are rotated on a certain position O2 outside of the pixel region as indicated by an arrow X, to form the irregular pattern B, C, . . . of FIGS. 11(B) and (C) in the other pixels 100a. As a result, different irregular pattern 8g may be formed in each pixel 100a. The rotation center can be moved while the irregularities are rotated on the position O2.

When the exposure mask 510 is designed, for example, the pixel 100a of FIG. 12(A) is designated as a reference pixel 100a', and the irregularities of the irregular pattern A formed in the reference pixel 100a' are rotated on a position O3 where the contact hole 4c is formed in the pixel region as indicated by an arrow X, to form the irregular pattern B, C, . . . of FIGS. 12(B) and (C) in the other pixels 100a. Therefore, different irregular pattern 8g are formed in each pixel 100a.

In the thus constructed active matrix type electro-optical device 100 using the above TFT array substrate 10, the irregular pattern 8g are formed in different shapes in each pixel 100a of the units 101a, 102a, 103a, . . . . In addition, positions of the irregular pattern 8g are different in the units 101a, 102a, 103a, . . . . Accordingly, the identical irregular pattern 8g is not repeated when the electro-optical device 100 is viewed from any angle. As a result, interference does not occur to the reflected light from the light-reflecting film 8a.

In this embodiment, in order to form the irregular pattern 8g having different shapes in each pixel 100a, the irregular pattern 8g obtained by rotating the irregularities of the reference pixel 100a' on a certain position are formed in different pixels 100a. Therefore, differences of the shape, size or distribution of the lower irregularity-formation film 13a are controlled in each pixel 100a. Because the irregularities of the reference pixel 100a' are rotated and then transferred to the pixel 100a, differences of the shape, size or distribution of the lower irregularity-formation film 13a formed on the reference pixel 100a' is the same level as the other pixel 100a, so differences are small.

In this embodiment, a plurality of lower irregularity-formation films 13a having different plane sizes is formed in one pixel. A number of the lower irregularity-formation films 13a having the same size in one pixel is identical in the whole pixels 100a.

A ratio of the irregularities that a gradient of a slanted surface formed at the side of the lower irregularity-formation film 13a exits within a certain angle range, for example, a ratio of the irregularities that the gradient of the slanted surface formed at the sides of the irregularities exists within the certain angle range is 5% or less in the pixels 100a.

Moreover, differences of an area of the lower irregularity forming films 13a are 10% or less between the pixels 100a.

As illustrated in FIG. 13, when the Delaunay diagram is drawn from position coordinates of the center of the lower side plurality of irregularity forming films 13a, differences of a length of the Delaunay line (adjacent distance of center coordinates) are below 10% in the pixels 100a.

Therefore, when seen from a slanted direction of 10 to 30° from a normal line direction of the TFT array substrate, differences of reflection luminance exist within 5% in the patterns, to prevent luminance heterogeneity between the pixels.

Figure 14:
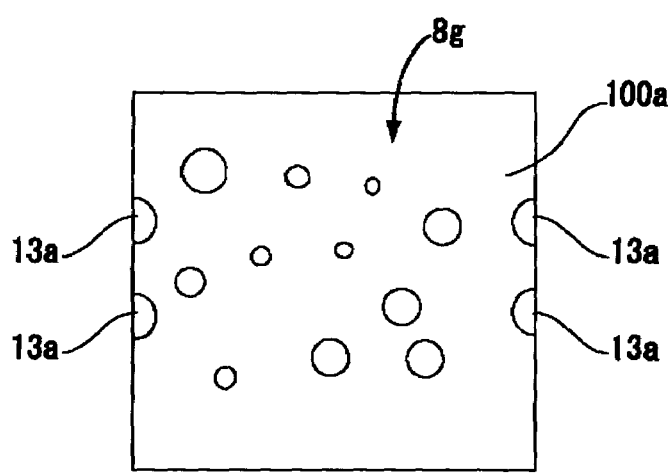
FIG. 14 is an explanatory diagram illustrating an example in that irregularities cut at the ends of the pixels.

As depicted in FIG. 14, when the lower irregularity-formation film 13a is cut at the end of the pixel 100a, the cut part is included in the opposite side. Accordingly, a sum of the areas of the lower irregularity forming films 13a is preferably integer times of a normal area. With this arrangement, even if the lower irregularity-formation film 13a is cut at the side of the pixel 100a, a number and area of the lower irregularity-formation films 13a can be substantially identical in one pixel.

In this embodiment, the contact hole 5d formation positions are made different in each pixel 100a as shown in FIG. 4, by using the irregular pattern design technique of FIGS. 9 to 12. In other words, when patterns of the contact-hole formation position of each pixel 100a are designed, as shown in FIG. 9, the plurality of pixels 100a formed in a matrix are grouped into a plurality of units 101a, 102a, 103a, . . . , and an exposure mask for patterning of the light-reflecting film 8a is designed to form the contract holes 5d in different positions in each pixel 100a of the units 101a, 102a, 103a, . . . . In addition, the contact hole 5d formation positions of the units 101a, 102a, 103a, . . . are made correspond to the irregular pattern A to L to be different in the units 101a, 102a, 103a, . . . .

The contact hole 5d formation positions of the pixels 100a formed in the same positions of the units 101a, 102a, 103a, . . . are all different in the units 101a, 102a, 103a, . . . .

In order to form the plurality of kinds of formation position patterns, for example, in this embodiment, the pixel 100a of FIG. 10(A) is designated as a reference pixel 100a', and the position of the contact hole 5d formed in the reference pixel 100a' is moved by rotating on a certain position O1 in the pixel region as indicated by an arrow X, thus obtained forming positions of the contact hole 5d of FIGS. 10(B) and (C) are applied to the other pixels 100a. As a result, the contact holes 5d of the pixels 100a have the same area, but different formation positions. Here, the rotation center can be moved while the forming position of the contact hole 5d is rotated on the position O1.

In addition, the pixel 100a of FIG. 11(A) is designated as a reference pixel 100a', and the forming position of the contact hole 5d formed in the reference pixel 100a' is moved by rotating on a certain position O2 out of the pixel region as indicated by an arrow X, thus obtained forming positions of the contact hole 5d of FIGS. 11(B) and (C) are applied to the other pixels 100a. Accordingly, the contact holes 5d of the pixels 100a have different formation positions. Here, the rotation center can be moved while the forming position of the contact hole 5d is rotated on the position O2.

The pixel 100a of FIG. 12(A) is designated as a reference pixel 100a', and the position of the contact hole 5d formed in the reference pixel 100a' is moved by rotating on a contact hole 4c formation position O3 in the pixel region as indicated by an arrow X, thus obtained forming positions of the contact hole 5d of FIGS. 12(B) and (C) are applied to the other pixels 100a. As a result, the contact holes 5d of the pixels 100a have different formation positions.

In the active matrix type electro-optical device 100 using the TFT array substrate 10 according to the present embodiment, the contact hole 5d formation positions are different in each pixel 100a of the units 101a, 102a, 103a, . . . . In addition, formation position patterns of the contact hole 5d are different in the units 101a, 102a, . . . . The contact hole 5d formation positions of the pixels 100a formed in the same positions of the units 101a, 102a, 103a, . . . are different in the units 101a, 102a, 103a, . . . . Accordingly, the contact holes 5d do not repeatedly appear in the same positions of each pixel 100a when the electro-optical device 100 is viewed from any angle. As a result, even though the light reflecting film 8a is formed in the contact hole 5d, interference due to the reflected light from the slanted surface of the inner wall of the contact hole 5d does not occur.

In this embodiment, in order to form the contact holes 5d in different positions in each pixel 100a, the position of the contact hole 5d of the reference pixel 100a' is moved by rotating on a certain position or moved by combination of rotation and parallel translation, to form the contact holes 5d in the other pixels 100a. Therefore, the contact holes 5d have different formation positions but the same area in each pixel 100a. Moreover, the relative positions between the contact holes 5d and the columnar protrusions composing the irregularities of the lower irregularity forming film 13d are identical in each pixel 100a.

The lower irregularity-formation film 13a forming the circular columnar protrusion having, for example, the circular plane shape has been explained. However, it should be understood that the plane shape of the columnar protrusion can be hexagonal, octagonal, or other polygonal shape. Here, the plane shape is preferably circular, regular hexagonal or regular octagonal in consideration of mask data and scattering properties. Further, holes may be formed instead of the columnar protrusion.

In this embodiment, the contact holes 5d are formed in different positions in the units, and the contact hole 5d formation position patterns are different in the units. However, it should be understood that the contact hole 5d formation positions can be different in each of the plurality of the pixels.

In addition, the contact-hole formation positions are different in each pixel of the units, but the contact hole formation patterns can be identical in the units. Thus, one pixel period of light interference can be extended to a unit period, to restrict interference.

In this embodiment, further, the irregular pattern shapes are different in each pixel of the units, and the irregular pattern positions are different in the units. However, the irregular pattern can be formed in different shapes in each of the plurality of the pixels.

In this embodiment, further, the present invention is applied to the total reflection type electro-optical device, but can be applied to the transflective type electro-optical device by forming a light-transmitting hole on a part of the light-reflecting film.

In addition, in this embodiment, the pixel electrode 8a made of an ITO film is formed on the light-reflecting film 8a applicable for both the total reflection type and transflective optical type. However, in the total reflection type electro-optical device, the light-reflecting film can be used as the pixel electrode, and the light-reflecting film can be formed on the pixel electrode made of an ITO film. In addition, the ITO film can be formed merely in the light-transmitting region. In this case, it is preferable that an overlapping region of the ITO film and the reflection film is formed on the boundary between a light-transmitting region and a reflection region, and the ITO film is formed at the upper or lower side of the reflection film and electrically connected thereto. In any case, if the light-reflecting film is formed in the contact hole, application of the present invention is effective.

The reflective or transflective matrix type electro-optical device 100 thus constructed can be used as a display unit of various electronic apparatuses, an example of which will be explained with reference to FIGS. 15, 16(A), and 16(B).

Figure 15:
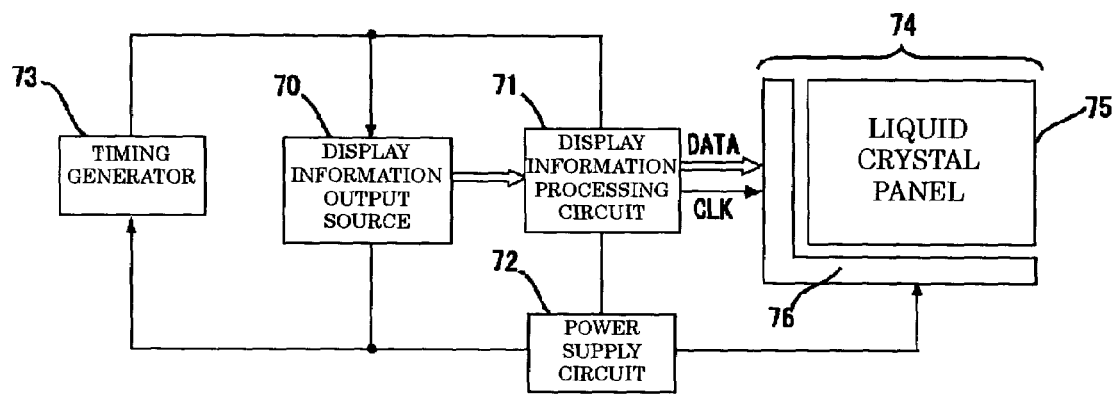
FIG. 15 is an exemplary block diagram illustrating a circuit structure of an electronic apparatus using the active matrix type electro-optical device according to the present invention as a display device.

FIG. 15 is an exemplary block diagram illustrating a circuit structure of the electronic apparatus using the active matrix type electro-optical device as a display device. Referring to FIG. 15, the electronic apparatus can include a display information output source 70, a display information processing circuit 71, a power source circuit 72, a timing generator 73 and a liquid crystal device 74. The liquid crystal device 74 can include a liquid crystal display panel 75 and a driving circuit 76. The active matrix type electro-optical device 100 can be used as the liquid crystal device 74.

The display information output source 70 includes a memory such as a ROM (Read Only Memory) and a RAM (Random Access Memory), a storage unit such as disks, and a synchronous circuit for synchronously outputting a digital image signal and supplies display information such as image signal of a certain format to the display information processing circuit 71 according to various clock signals generated by the timing generator 73.

The display information processing circuit 71 has various known circuits such as a serial-parallel transformation circuit, an amplification/inversion circuit, a rotation circuit, a gamma correction circuit and a clamp circuit. The display information processing circuit 71 processes inputted display information and supplies the image signal to the driving circuit 76 with the clock signal CLK. The power source circuit 72 supplies a predetermined voltage to the constitutional elements.

Figure 16:
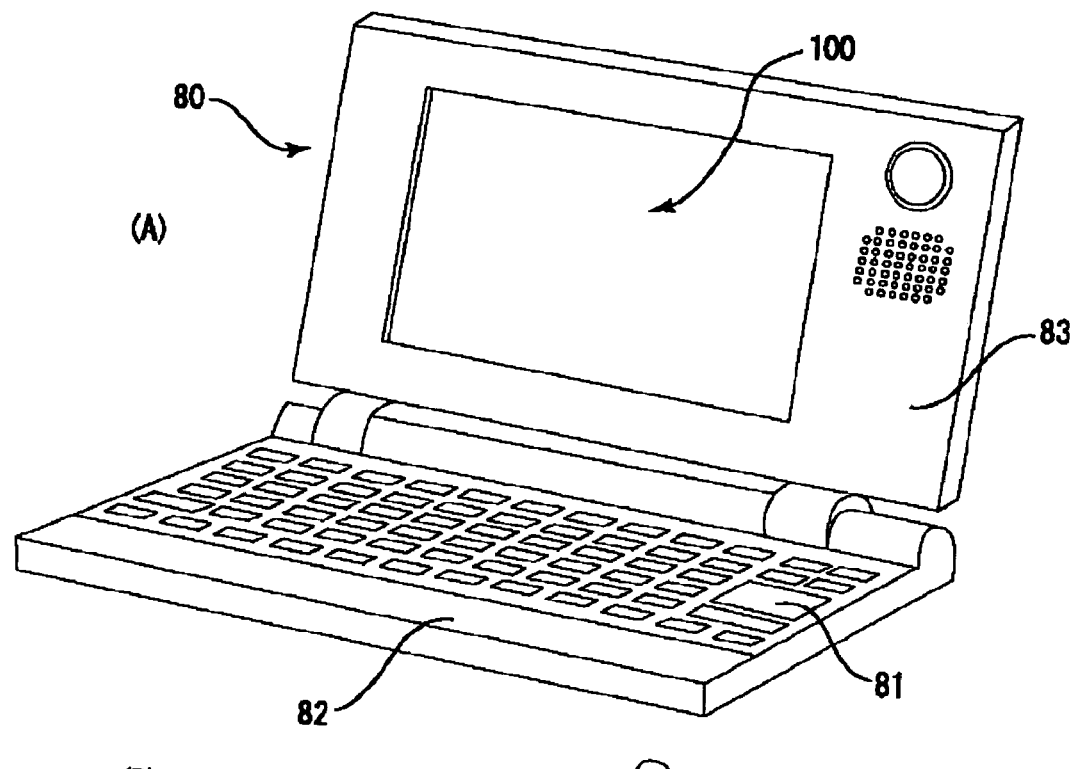
FIGS. 16(A) and (B) are explanatory diagrams respectively illustrating a portable personal computer and a cellular phone as an example of the electronic apparatus using the active matrix type electro-optical device according to the present invention as the display device.
Figure 16:
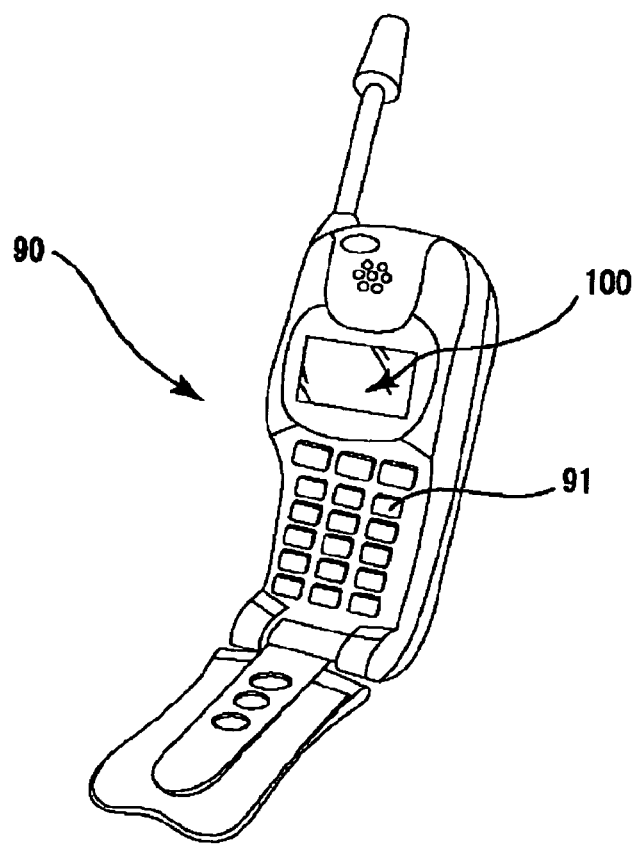
Figure 17:
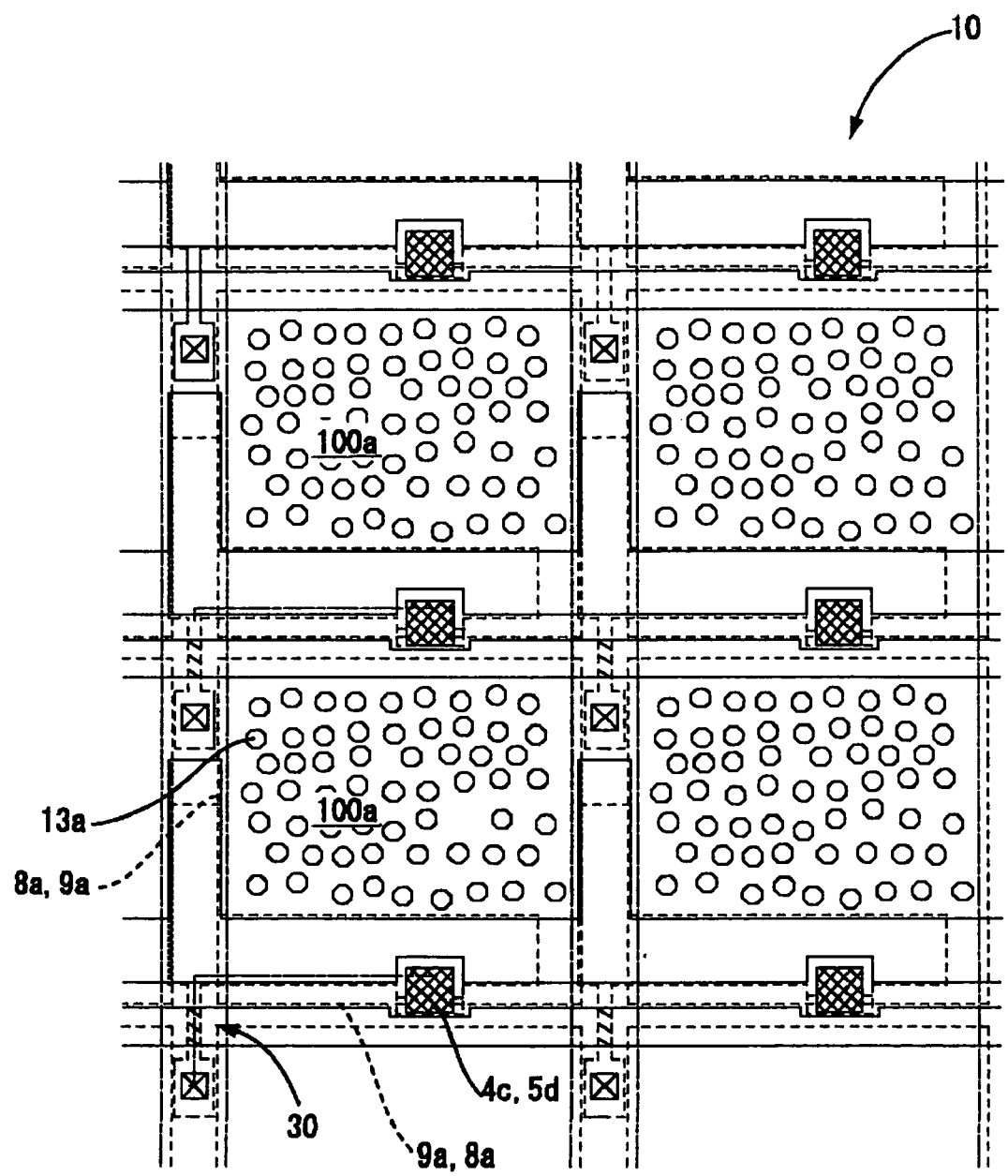
FIG. 17 is plan view illustrating pixels of a TFT array substrate in a conventional active matrix type electro-optical device.
Figure 18:
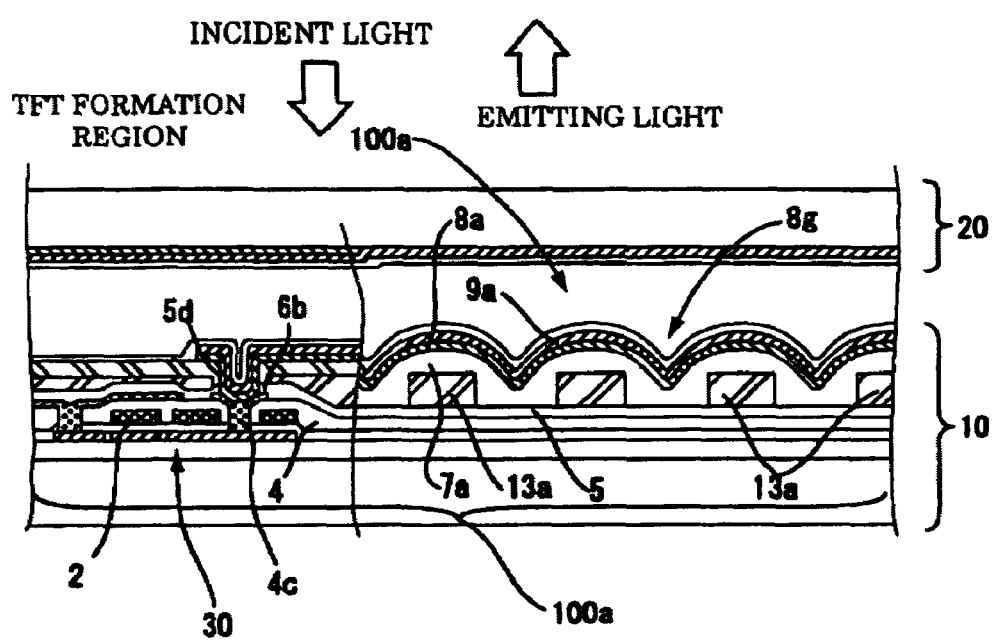
FIG. 18 is a cross-sectional view of a part of pixels in the conventional active matrix type electro-optical device.

FIG. 16(A) illustrates a portable personal computer as one example of the electronic apparatus according to the invention. The personal computer 80 shown here includes a main body unit 82 having a keyboard 81 and a liquid crystal display unit 83. The liquid crystal display unit 83 includes the aforementioned active matrix type electro-optical device 100.

FIG. 16(B) illustrates a cellular phone as another example of the electronic apparatus according to the invention. The cellular phone 90 includes a plurality of operation buttons 91 and a display unit including the aforementioned active matrix type electro-optical device 100.

As discussed above, in accordance with the present invention, the contact-hole formation positions are different in each pixel, and thus the contact holes are not repeated in the same positions of the pixels when the electro-optical device is viewed from any angle. Even if the light-reflecting film is formed in the contact hole, interference due to the reflected light from the slanted part of the inner wall of the contact hole does not occur.

While this invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. Various changes may be made without departing from the spirit and scope of the invention.

What is claimed is:

1. An active matrix type electro-optical device, comprising:
   a plurality of pixels arranged in a matrix on a substrate holding an electro-optical material; and
   each pixel including a thin film transistor that switches pixels, an irregularity forming film on which a plurality of irregularities including protrusions or holes are dispersed, and a light-reflecting film formed on the irregularity forming film,
   the light-reflecting film having on its surface an irregular pattern that scatters light due to the irregularity forming film, and the light-reflecting film being formed in contact holes which are formed in an interlayer insulating film,
   each of the plurality of pixels having a contact hole formation-position, the plurality of pixels containing a first array of pixels and a second array of pixels, the first and second array of pixels having identical dimensions, a pattern of contact hole formation-position in the first array of pixels being different from a pattern of contact hole formation-position in the second array of pixels.

2. The active matrix type electro-optical device according to claim 1, the contact-hole formation positions being different for each pixel in the units.

3. The active matrix type electro-optical device according to claim 1, the contact-hole formation positions of the pixels located in same positions and all positions of contact-holes being different for each unit.

4. The active matrix type electro-optical device according to claim 1, the pixels having different patterns at least in the units, and the irregular pattern positions being different for each unit.

5. The active matrix type electro-optical device according to claim 1, the pixels having different patterns.

6. The active matrix type electro-optical device according to claim 1, a drain electrode being formed almost over an entire pixel at a lower side of the light-reflecting film in all of the pixels.

7. The active matrix type electro-optical device according to claim 1, the contact holes formed in each pixel having a same area.

8. The active matrix type electro-optical device according to claim 1, liquid crystal being held as electro-optical material between the substrate, which is a first substrate, and a second substrate facing the first substrate.

9. An electro apparatus comprising the active matrix type electro-optical device according to claim 1 as a display unit.

* * * * *